(12) United States Patent  (10) Patent No.: US 11,962,062 B2
Rhoden et al.  (45) Date of Patent: *Apr. 16, 2024

(54) HEAT EXCHANGER RIB FOR MULTI-FUNCTION APERTURE

(71) Applicant: Hamilton Sundstrand Corporation, Charlotte, NC (US)

(72) Inventors: William E. Rhoden, Fernandina Beach, FL (US); Anders Walker, Marion, IA (US); David Cripe, Mount Vernon, IA (US); Ross Keith Wilcoxon, Cedar Rapids, IA (US); Jeremiah Wolf, Atkins, IA (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/059,704

(22) Filed: Nov. 29, 2022

(65) Prior Publication Data

US 2023/0113572 A1  Apr. 13, 2023

Related U.S. Application Data

(62) Division of application No. 17/186,503, filed on Feb. 26, 2021, now Pat. No. 11,539,109.

(Continued)

(51) Int. Cl.
*H01Q 1/02* (2006.01)
*B33Y 80/00* (2015.01)
(Continued)

(52) U.S. Cl.
CPC .............. *H01Q 1/02* (2013.01); *F02C 7/224* (2013.01); *F28F 3/12* (2013.01); *F28F 9/02* (2013.01);
(Continued)

(58) Field of Classification Search
CPC ...... H01Q 1/02; H01Q 21/0025; F02C 7/224; F28F 3/12; F28F 9/02; F28F 2009/0297;
(Continued)

(56) References Cited

U.S. PATENT DOCUMENTS 5,327,152 A  7/1994 Kruger et al.
5,424,916 A  6/1995 Martin
(Continued)

FOREIGN PATENT DOCUMENTS

CN  105071011 A  * 11/2015
CN  105914476 A  * 8/2016
(Continued)

OTHER PUBLICATIONS

Extended European Search Report for EP Application No. 21164382.0, dated Aug. 2, 2021, pp. 9.

*Primary Examiner* — Len Tran
*Assistant Examiner* — Gustavo A Hincapie Serna
(74) *Attorney, Agent, or Firm* — Kinney & Lange, P. A.

(57) ABSTRACT

Phased array antennas, such as a multi-function aperture, are limited in performance and reliability by traditional air-cooled thermal management systems. A fuel-cooled multi-function aperture passes engine fuel through channels within the ribs of the multi-function aperture to provide better heat transfer than can be achieved through air cooled systems. The increased heat transfer and thermal management results in a multi-function aperture with improved performance and reliability.

16 Claims, 6 Drawing Sheets

Related U.S. Application Data

(60) Provisional application No. 63/000,131, filed on Mar. 26, 2020.

(51) Int. Cl.
*F02C 7/224* (2006.01)
*F28F 3/12* (2006.01)
*F28F 9/02* (2006.01)
*H05K 7/20* (2006.01)

(52) U.S. Cl.
CPC .......... *H05K 7/20872* (2013.01); *B33Y 80/00* (2014.12); *F28F 2009/0297* (2013.01)

(58) Field of Classification Search
CPC ........... H05K 7/20872; H05K 7/20636; B33Y 80/00; G01S 7/027
USPC .................................................... 165/107.19
See application file for complete search history.

(56) References Cited

U.S. PATENT DOCUMENTS

| | | | |
|---|---|---|---|
| 7,129,908 B2 | 10/2006 | Edward et al. | |
| 7,324,336 B2 | 1/2008 | Vos et al. | |
| 7,859,835 B2* | 12/2010 | Puzella ................... | H01Q 1/02 343/702 |
| 7,889,147 B2 | 2/2011 | Tam et al. | |
| 8,537,059 B2 | 9/2013 | Johnson et al. | |
| 8,659,901 B2* | 2/2014 | MacManus ........ | H05K 7/20127 343/700 R |
| 8,810,448 B1 | 8/2014 | Ellsworth et al. | |
| 9,172,145 B2 | 10/2015 | Puzella et al. | |
| 10,211,127 B1 | 2/2019 | Harris et al. | |
| 10,468,741 B2 | 11/2019 | Day | |
| 10,506,736 B2* | 12/2019 | Zheng ................ | H05K 7/20163 |
| 10,512,152 B2 | 12/2019 | Smith et al. | |
| 10,547,117 B1* | 1/2020 | Tomasic ................. | H01Q 15/24 |
| 10,750,377 B1* | 8/2020 | Zihir ..................... | H04W 16/28 |
| 11,196,172 B2* | 12/2021 | Xi ........................... | H01Q 3/44 |
| 2006/0090489 A1 | 5/2006 | Haws | |
| 2007/0035448 A1 | 2/2007 | Navarro et al. | |
| 2008/0150832 A1* | 6/2008 | Ingram ................ | H01Q 21/061 343/893 |
| 2010/0039770 A1 | 2/2010 | Danello et al. | |
| 2011/0267776 A1 | 11/2011 | Porreca et al. | |
| 2011/0315354 A1 | 12/2011 | Johnson | |
| 2012/0097374 A1 | 4/2012 | Altman | |
| 2012/0218149 A1* | 8/2012 | Edward .................. | H01Q 21/08 342/368 |
| 2013/0299232 A1* | 11/2013 | Fitz-Patrick ....... | H05K 7/20636 174/547 |
| 2016/0029514 A1* | 1/2016 | Alakoc .............. | H05K 7/20254 165/80.4 |
| 2016/0172755 A1* | 6/2016 | Chen .................... | H01Q 21/061 342/371 |
| 2016/0218412 A1 | 7/2016 | Day | |
| 2017/0104268 A1 | 4/2017 | Ford et al. | |
| 2017/0187105 A1* | 6/2017 | Emerick ................ | H01Q 21/22 |
| 2017/0237181 A1* | 8/2017 | Chen .................. | H01Q 21/0025 343/702 |
| 2018/0310436 A1 | 10/2018 | Egami et al. | |
| 2019/0029105 A1 | 1/2019 | Smith et al. | |
| 2019/0089067 A1* | 3/2019 | Zihir ........................ | H01Q 3/28 |
| 2019/0120142 A1* | 4/2019 | Rhoden .................. | B01D 53/22 |
| 2019/0181071 A1* | 6/2019 | Harris ................... | H01L 23/473 |
| 2019/0181516 A1* | 6/2019 | Seki ...................... | H01M 10/613 |
| 2019/0288402 A1* | 9/2019 | Rashidian ............. | H01Q 1/38 |
| 2019/0320556 A1 | 10/2019 | Dariavach et al. | |
| 2019/0356055 A1 | 11/2019 | Saito et al. | |
| 2020/0003497 A1 | 1/2020 | Aston et al. | |
| 2021/0257739 A1* | 8/2021 | Mathews ............. | H01Q 21/065 |

FOREIGN PATENT DOCUMENTS

| | | | | |
|---|---|---|---|---|
| CN | 106981720 A | * | 7/2017 | ......... H01Q 1/38 |
| CN | 107064879 A | | 8/2017 | |
| CN | 109511253 A | | 3/2019 | |
| CN | 109687089 A | | 4/2019 | |
| CN | 111106421 A | | 5/2020 | |
| CN | 112020280 A | | 12/2020 | |
| JP | 2003065070 A | | 3/2003 | |
| WO | WO-2008121168 A3 | * | 11/2008 | ......... H01Q 21/0087 |

* cited by examiner

HEAT EXCHANGER RIB FOR MULTI-FUNCTION APERTURE

CROSS-REFERENCE TO RELATED APPLICATION(S)

This application is a divisional of U.S. application Ser. No. 17/186,503 filed Feb. 26, 2021 for "HEAT EXCHANGER RIB FOR MULTI-FUNCTION APERTURE" by W. E. Rhoden, A. Walker, D. Cripe, R. K. Wilcoxon, and J. Wolf, which claims the benefit of U.S. Provisional Application No. 63/000,131 filed Mar. 26, 2020 for "HEAT EXCHANGER RIB FOR MULTI-FUNCTION APERTURE" by W. E. Rhoden, A. Walker, D. Cripe, R. K. Wilcoxon, and J. Wolf, the disclosures of which are incorporated into this application by reference.

BACKGROUND

The present disclosure relates to liquid cooling systems, and in particular, to a fuel cooled system for a phased array antenna.

Many aircraft are equipped with on-board air-cooling systems configured to cool various electronic components on the aircraft, such as the aircraft's radar system. The air-cooling systems route air through channels within the aircraft to the hot electronic components that require cooling. The cool air absorbs heat from the various electronic components and then transfers the heated air to another system within the aircraft or exhausts the heated air from the aircraft. Air-cooling systems are limited by the heat transfer coefficient and mass flow rate of the air and are not suitable for all cooling applications. Some electronic components, such as phased array antennas, benefit from a liquid cooling system because liquid coolant is particularly effective in absorbing heat due to its high heat transfer coefficient, density, and specific heat, as compared to air. Effective thermal management improves performance and reliability of the electronic components and can be critical to the success of the system.

A multi-function aperture is a type of phased array antenna that is configured to transmit and receive a plurality of radar and communication signals. A phased array antenna consolidates a plurality of individual antennas into a single wideband design, resulting in a more efficient system. Phased array antennas, such as the multi-function aperture, can be used for many different applications, such as radar, electronic attack, directional communications, and electronic intelligence, among other applications. Previous applications of the multi-function aperture utilize air-cooled systems, limiting the performance and reliability of the multi-function aperture. Future multi-function aperture designs challenge the limits of air-cooled thermal management systems. Therefore, the multi-function aperture requires increased cooling and thermal management to achieve improved performance and reliability.

SUMMARY

In one example, a fuel-cooled multi-function aperture includes a multi-function aperture, a first manifold, and a second manifold. The multi-function aperture includes a plurality of circuit card modules, wherein each of the plurality of circuit card modules includes a first circuit card, a second circuit card, and a rib. The rib is positioned between the first circuit card and the second circuit card and includes a first channel and a second channel. The first manifold includes a first inlet and the second manifold includes a second inlet. The first inlet and second inlet are configured to receive fuel and then flow the fuel into the first channel and the second channel of the rib to cool each of the plurality of circuit card modules.

In another example, a method of cooling a multi-function aperture includes transferring fuel from a fuel tank to a multi-function aperture. Flowing the fuel through at least one rib of the multi-function aperture. Removing heat from the multi-function aperture as the fuel flows through the at least one rib of the multi-function aperture. The fuel is then transferred to an engine for combustion by the engine.

DETAILED DESCRIPTION

Figure 1:
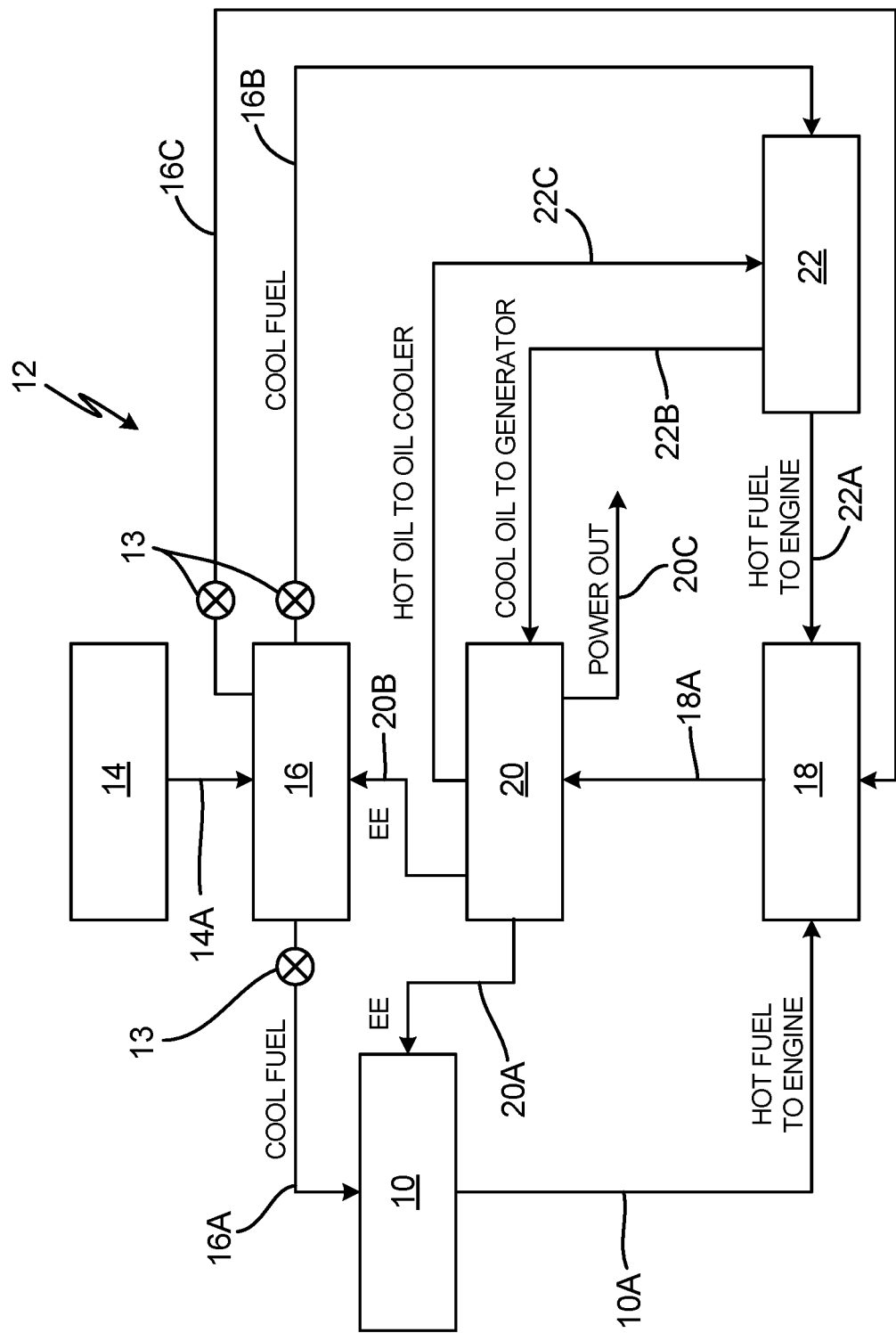
FIG. 1 is a schematic view of a fuel-cooled multi-function aperture in an engine system.

FIG. 1 is a schematic view of fuel-cooled multi-function aperture 10 in engine system 12. Engine system 12 includes fuel-cooled multi-function aperture (FCMFA) 10, fuel tank 14, fluid pump 16, engine 18, generator 20, and oil cooler 22. Fuel tank 14 is fluidly connected through conduit 14A to fluid pump 16. Fluid pump 16 is fluidly connected through conduit 16A to FCMFA 10 and fluidly connected through conduit 16B to oil cooler 22. FCMFA 10 is fluidly connected through conduit 10A to engine 18. Oil cooler 22 is fluidly connected through conduit 22A to engine 18 and fluidly connected through conduit 22B and conduit 22C to generator 20. Engine 18 is mechanically connected through connection 18A to generator 20. Generator 20 is electrically connected through electrical connection 20A to FCMFA 10 and electrically connected through electrical connection 20B to fluid pump 16. Further, generator 20 is electrically connected through electrical connection 20C to other components to provide electric power to the other components.

Fuel tank 14 is a fluid vessel that can store fuel for use in engine 18. The fuel within fuel tank 14 can be a liquid fuel that is capable of combustion in engine 18. Engine 18 can be an internal combustion engine or a gas turbine engine. Fluid pump 16 is configured to force the fuel within fuel tank 14 through conduit 16A to FCMFA 10. The cool fuel that reaches FCMFA 10 flows through FCMFA 10 to remove heat from FCMFA 10, as will be discussed in detail below. The cool fuel that flows through FCMFA 10 absorbs and removes heat from FCMFA 10 and dispenses from FCMFA 10 as heated fuel. The heated fuel flows through conduit 10A to engine 18 where the fuel is combusted to generate rotational energy. A portion of the rotational energy created by engine 18 is transferred through connection 18A to generator 20. Generator 20 converts the rotational energy into electrical energy (EE) and the electrical energy is supplied to FCMFA 10 and fluid pump 16 to provide electrical power to both components.

Fluid pump 16 is also configured to force the fuel from fuel tank 14 through conduit 16B to oil cooler 22. Operation of generator 20 creates hot oil that is dispensed by a pump (not shown) from generator 20 through conduit 22C to oil cooler 22. Heat exchangers (not shown) within oil cooler 22 transfer heat from the hot oil to the cool fuel received from fuel tank 14. The heated fuel then flows through conduit 22A to engine 18 where the fuel is combusted to generate rotational energy. Removing heat from the hot oil produces cooled oil, which then flows through conduit 22B to generator 20 for use within generator 20. Engine system 12 uses heat exchangers to pre-heat the fuel before combustion in engine 18, which results in a more efficient engine 18 with less wasted energy. Further, removing heat from FCMFA 10 and generator 20 provides the advantages of improved performance and reliability of both FCMFA 10 and generator 20. Engine system 12 also includes conduit 16C which extends between fluid pump 16 and engine 18. Conduit 16C is a bypass which provides fuel directly to engine 18 from fuel tank 14. Valves 13 are installed on or in conduit 16A, conduit 16B, and conduit 16C and valves 13 are configured to actively control the flow rate through each conduit 16A, 16B, and 16C. Further, engine system 12 includes a controller (not shown) used to control all commands and operational functions of engine system 12.

Figure 2A:
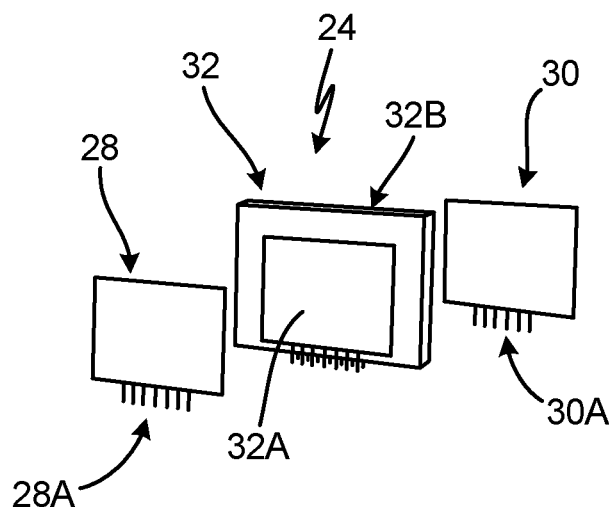
FIG. 2A is a perspective view of a circuit card module in an exploded configuration.
Figure 2B:
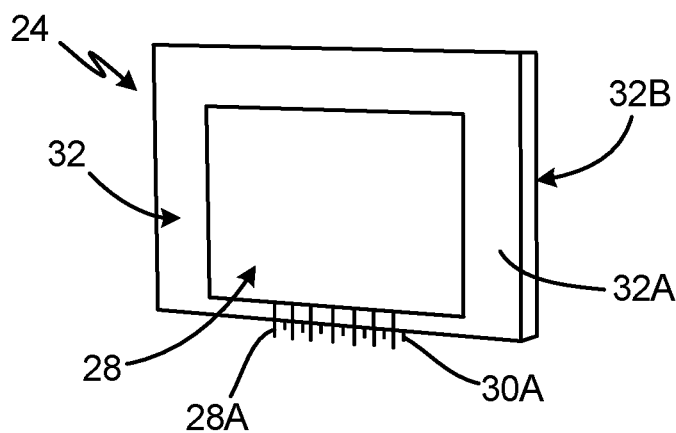
FIG. 2B is a perspective view of the circuit card module in an assembled configuration.
Figure 2C:
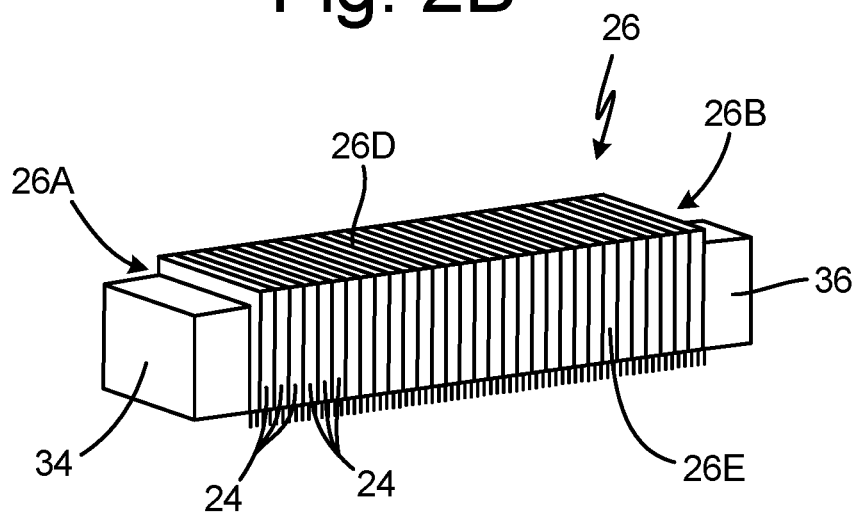
FIG. 2C is a perspective view of a multi-function aperture.

FIG. 2A is a perspective view of circuit card module 24 in an exploded configuration. FIG. 2B is a perspective view of circuit card module 24 in an assembled configuration. FIG. 2C is a perspective view of multi-function aperture (MFA) 26. FIGS. 2A-2C will be discussed together. Circuit card module 24 includes first circuit card 28, second circuit card 30, and rib 32. First circuit card 28 includes electrical pins 28A, in one or more electrical connectors, all extending from one side of first circuit card 28, in which all electrical pins 28A are parallel with one another. Second circuit card 30 includes electrical pins 30A all extending from one side of second circuit card 30, in which all electrical pins 30A are parallel with one another. In the embodiment shown, first circuit card 28 and second circuit card 30 each include eight electrical pins 28A and 30A, respectively. In another embodiment, first circuit card 28 and second circuit card 30 can each include more than or less than eight electrical pins.

First circuit card 28 is attached to first side 32A of rib 32 and second circuit card 30 is attached to second side 32B of rib 32, opposite first side 32A of rib 32. In other words, rib 32 is positioned between and attached to both first circuit card 28 and second circuit card 30. When first circuit card 28 and second circuit card 30 are attached to and installed on first side 32A and second side 32B, respectively, of rib 32, electrical pins 28A of first circuit card 28 and electrical pins 30A of second circuit card 30 are parallel with each other. The installation of first circuit card 28 and second circuit card 30 on rib 32 creates circuit card module 24. Circuit card module 24 is configured to transmit and receive radar, communication, and other signals.

MFA 26 is a phased array antenna configured to transmit and receive a plurality of radar, communication, and other signals. MFA 26 includes a plurality of circuit card modules 24, first control circuit 34, and second control circuit 36. Each of the plurality of circuit card modules 24 is positioned adjacent to at least one of the plurality of circuit card modules. More specifically, the two end circuit card modules 24 are positioned adjacent one other circuit card module 24. In contrast, all the circuit card modules 24 positioned between the two ends are positioned adjacent two other circuit card modules 24. The plurality of circuit card modules 24 are positioned in a stacked configuration, in which each circuit card module 24 is positioned in an organized manner adjacent to another circuit card module 24. The plurality of circuit card modules 24 are positioned such that the electrical pins 28A and 30A are all parallel to each other and extending from the same side of their respective circuit card. In the embodiment shown, there are thirty-two circuit card modules 24 creating a 64 by 8 array of pins. In another embodiment, there can be more than or less than thirty-two circuit card modules.

First control circuit 34 is positioned adjacent to one of the plurality of circuit card modules 24 at first end 26A of MFA 26. Second control circuit 36 is positioned adjacent to one of the plurality of circuit card modules 24 at second end 26B of MFA 26. First control circuit 34 and second control circuit 36 are configured to control the operation of each individual first circuit card 28 and second circuit card 30. The assembly of the plurality of circuit card modules 24, first control circuit 34, and second control circuit 36 creates MFA 26, which is configured to transmit and receive one or a plurality of radar, communication, and other signals.

Figure 3A:
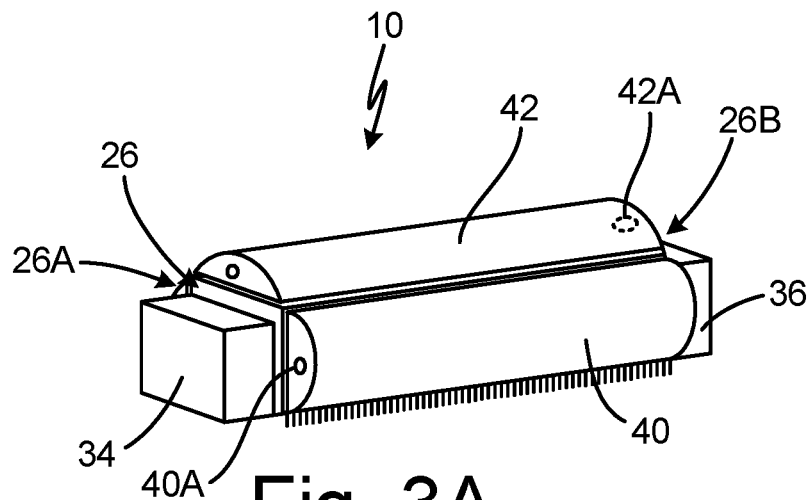
FIG. 3A is a perspective view of a first embodiment of the fuel-cooled multi-function aperture.
Figure 3B:
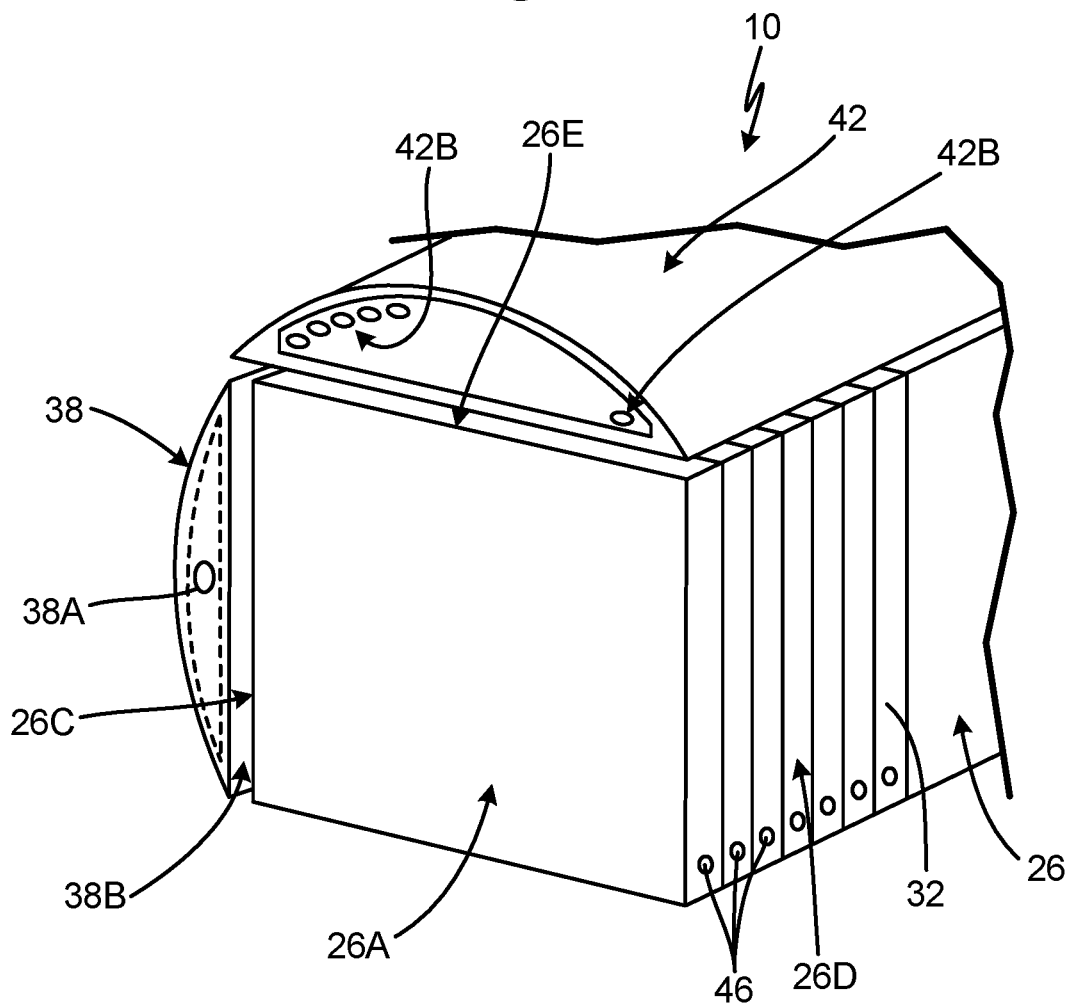
FIG. 3B is a close-up perspective view of a first embodiment of the fuel-cooled multi-function aperture.
Figure 3C:
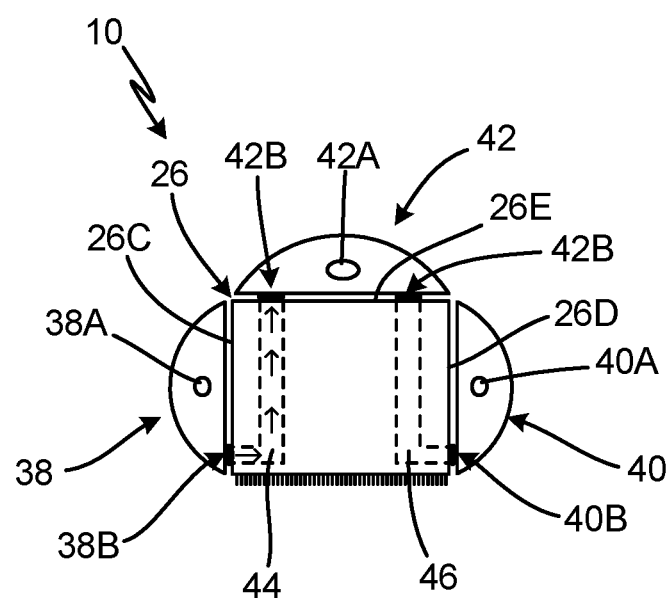
FIG. 3C is a front view of a first embodiment of the fuel-cooled multi-function aperture.

FIG. 3A is a perspective view of a first embodiment of FCMFA 10. FIG. 3B is a close-up perspective view of the first embodiment of FCMFA 10 with first control circuit 34 removed for clarity. FIG. 3C is a front view of the first embodiment of FCMFA 10 with first control circuit 34 removed for clarity. FIGS. 3A-3C will be discussed together. FCMFA 10 includes MFA 26, first manifold 38, second manifold 40, and third manifold 42. First manifold 38 is positioned on first side 26C of MFA 26, second manifold 40 is positioned on second side 26D of MFA 26, and third manifold 42 is positioned on third side 26E of MFA 26. Each of first manifold 38, second manifold 40, and third manifold 42 have a semi-circular profile with an outer diameter of ten inches or less.

First manifold 38 includes first inlet 38A positioned at first end 26A of MFA 26 and a plurality of first apertures 38B extending along a bottom portion of first manifold 38. First manifold 38 is a fluidly sealed component with an outer cover and a void within the sealed outer cover. Each end of first manifold 38 includes a fluidly sealed cover with the exception of first inlet 38A. First inlet 38A can be an aperture with a fluid-tight fitting suitable for transferring a liquid without leakage. Each of the plurality of first apertures 38B can be an opening or hole with a fluid-tight fitting suitable for transferring a liquid without leakage. The fluid-tight fitting can be positioned between each of the plurality of first apertures 38B and MFA 26. The fluid-tight fitting can be a seal, a liquid quick-disconnect, a blind mate liquid connector, or an O-ring, among other options. Each of the plurality of first apertures 38B is aligned with and in fluid communication with first channel 44 of each rib 32 of MFA 26, discussed further below. Although first inlet 38A is shown in a specific location, first inlet 38A can be positioned anywhere on first manifold 38.

First manifold 38 is attached to each and every one of the plurality of circuit card modules 24 through a fastener on first side 26C of MFA 26. Attaching first manifold 38 to each circuit card module 24 secures circuit card module 24 in an assembled form creating MFA 26 and also enhances heat transfer from MFA 26. First manifold 38 can be a single-piece construction that is manufactured using additive manufacturing technology. First manifold 38 can be constructed from a steel, aluminum, titanium, metal alloy, or a polymer. Additively manufacturing first manifold 38 provides the benefit of allowing first manifold 38 to be a single-piece construction, eliminating abutting components that would require additional sealing components. Therefore, additively manufacturing first manifold 38 eliminates locations for potential leakage. First manifold 38 is configured to receive fuel from fuel tank 14 (FIG. 1) through first inlet 38A, flow and fill the fuel into the void in first manifold 38, and then dispense the fuel through the plurality of first apertures 38B into first channel 44 of each rib 32 of MFA 26. The fuel that flows into first channel 44 absorbs heat produced by MFA 26 and removes the heat from MFA 26, cooling MFA 26 in the process.

Second manifold 40 includes second inlet 40A positioned at first end 26A of MFA 26 and a plurality of second apertures 40B extending along a bottom portion of second manifold 40. Second manifold 40 is a fluidly sealed component with an outer cover and a void within the sealed outer cover. Each end of second manifold 40 includes a fluidly sealed cover with the exception of second inlet 40A. Second inlet 40A can be an aperture with a fluid-tight fitting suitable for transferring a liquid without leakage. Each of the plurality of second apertures 40B can be an opening or hole with a fluid-tight fitting suitable for transferring a liquid without leakage. The fluid-tight fitting can be positioned between each of the plurality of second apertures 40B and MFA 26. The fluid-tight fitting can be a seal, a liquid quick-disconnect, a blind mate liquid connector, or an O-ring, among other options. Each of the plurality of second apertures 40B is aligned with and in fluid communication with second channel 46 of each rib 32 of MFA 26, discussed further below. Although second inlet 40A is shown in a specific location, second inlet 40A can be positioned anywhere on second manifold 40.

Second manifold 40 is attached to each and every one of the plurality of circuit card modules 24 through a fastener on second side 26D of MFA 26. Attaching second manifold 40 to each circuit card module 24 secures circuit card module 24 in an assembled form creating MFA 26 and also enhances heat transfer from MFA 26. Second manifold 40 can be a single-piece construction that is manufactured using additive manufacturing technology. Second manifold 40 can be constructed from a steel, aluminum, titanium, metal alloy, or a polymer. Additively manufacturing second manifold 40 provides the benefit of allowing second manifold 40 to be a single-piece construction, eliminating abutting components that would require additional sealing components. Therefore, additively manufacturing second manifold 40 eliminates locations for potential leakage. Second manifold 40 is configured to receive fuel from fuel tank 14 (FIG. 1) through second inlet 40A, flow and fill the fuel into the void in second manifold 40, and then dispense the fuel through the plurality of second apertures 40B into second channel 46 of each rib 32 of MFA 26. The fuel that flows into second channel 46 absorbs heat produced by MFA 26 and removes the heat from MFA 26, cooling MFA 26 in the process.

Third manifold 42 includes third outlet 42A positioned at second end 26B of MFA 26 and a plurality of third apertures 42B extending along both a first side and second side of third manifold 42. Third manifold 42 is a fluidly sealed component with an outer cover and a void within the sealed outer cover. Each end of third manifold 42 includes a fluidly sealed cover with the exception of third outlet 42A. Third outlet 42A can be an aperture with a fluid-tight fitting suitable for transferring a liquid without leakage. Each of the plurality of third apertures 42B can be an opening or hole with a fluid-tight fitting suitable for transferring a liquid without leakage. The fluid-tight fitting can be positioned between each of the plurality of third apertures 42B and MFA 26. The fluid-tight fitting can be a seal, a liquid quick-disconnect, a blind mate liquid connector, or an O-ring, among other options. Each of the plurality of third apertures 42B is aligned with and in fluid communication with first channel 44 or second channel 46 of each rib 32 of MFA 26, discussed further below. Although third outlet 42A is shown in a specific location, third outlet 42A can be positioned anywhere on third manifold 42.

Third manifold 42 is attached to each and every one of the plurality of circuit card modules 24 through a fastener on third side 26E of MFA 26. Attaching third manifold 42 to each circuit card module 24 secures circuit card module 24 in an assembled form creating MFA 26 and also enhances heat transfer from MFA 26. Third manifold 42 can be a single-piece construction that is manufactured using additive manufacturing technology. Third manifold 42 can be constructed from a steel, aluminum, titanium, metal alloy, or a polymer. Additively manufacturing third manifold 42 provides the benefit of allowing third manifold 42 to be a single-piece construction, eliminating abutting components that would require additional sealing components. Therefore, additively manufacturing third manifold 42 eliminates locations for potential leakage. Third manifold 42 is configured to receive heated fuel from first channel 44 and second channel 46 of rib 32 through the plurality of third apertures 42B, flow and fill the heated fuel into the void in third manifold 42, and then dispense the fuel through third outlet 42A into conduit 10A (FIG. 1). The heated fuel then flows through conduit 10A to engine 18 where the fuel is combusted.

In the embodiment shown in FIGS. 3A-3C, first channel 44 extends from first side 26C of MFA 26 into a center portion of rib 32 and then first channel 44 exits through third side 26E of MFA 26. First channel 44 is configured to receive cool fuel through first side 26C of MFA 26 and then dispense heated fuel through third side 26E of MFA 26 into third manifold 42. Second channel 46 extends from second side 26D of MFA 26 into a center portion of rib 32 and then second channel 46 exits through third side 26E of MFA 26. Second channel 46 is configured to receive cool fuel through second side 26D of MFA 26 and then dispense heated fuel through third side 26E of MFA 26 into third manifold 42.

Each rib 32 of MFA 26 includes first channel 44 in fluid communication with first manifold 38 and third manifold 42. Likewise, each rib 32 includes second channel 46 in fluid communication with second manifold 40 and third manifold 42. Rib 32 can be a single-piece construction that is manufactured using additive manufacturing technology. Rib 32 can be constructed from a steel, aluminum, titanium, metal alloy, or a polymer. Additively manufacturing rib 32 provides the benefit of allowing rib 32 to be a single-piece construction, eliminating abutting components that would require additional sealing features. Therefore, additively manufacturing rib 32 eliminates locations for potential leakage. Additively manufacturing rib 32 also provides the benefit of allowing for complex geometry of first channel 44 and second channel 46, which can be used to optimize the heat transfer between the fuel and rib 32.

In operation, fuel from fuel tank 14 is pumped using fluid pump 16 through conduit 16A to FCMFA 10. The cool fuel reaches a valve (not shown) where the fuel is split into individual tubes that are attached to first inlet 38A and second inlet 40A of first manifold 38 and second manifold, respectively. The fuel flows into first inlet 38A and second inlet 40A and into first manifold 38 and second manifold 40, respectively. The fuel then flows through the plurality of first apertures 38B and the plurality of second apertures 40B into first channel 44 and second channel 46, respectively, of each rib 32 of MFA 26. The cool fuel flowing through first channel 44 and second channel 46 of each rib 32 absorbs heat produced by MFA 26, heating the fuel. The heated fuel then dispenses from first channel 44 and second channel 46 through the plurality of third apertures 42B and into third manifold 42. The heated fuel within third manifold 42 is then dispensed through third outlet 42A into conduit 10A, guiding the fuel to engine 18 where the fuel is combusted. When the fuel is flowing through each manifold the fuel remains separated and un-mixed. The fuel is only mixed again after it is dispensed into third manifold 42. The fuel removes heat from MFA 26 and cools MFA 26 more than can be achieved by using air as the cooling fluid. The use of both first channel 44 and second channel 46 increases the heat transfer rate and therefore increases the cooling of MFA 26. Cooling of MFA 26 is key to the success of the system because a cooled MFA 26 has improved performance and reliability. While the described configuration places the heat exchangers such that the flow through them is parallel, other embodiments in which the flow through the heat exchangers is in series or a hybrid of series and parallel flow, may be utilized to meet system pressure and/or flow rate requirements.

Figure 4A:
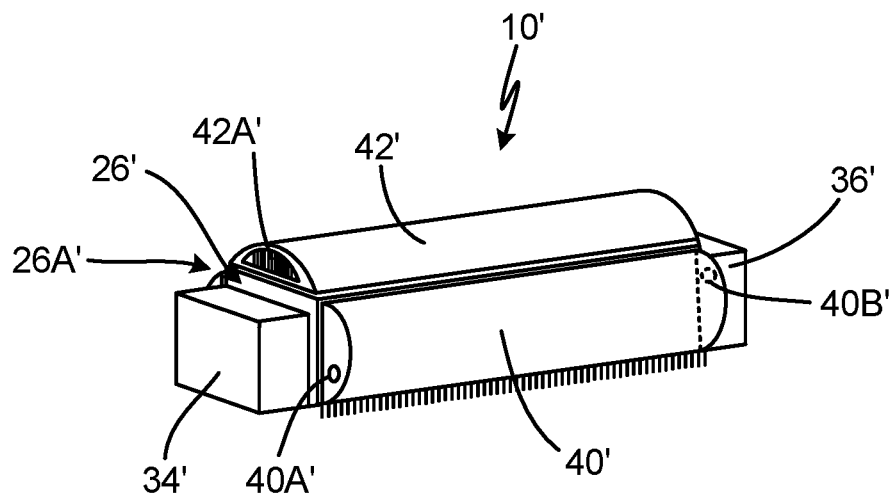
FIG. 4A is a perspective view of a second embodiment of the fuel-cooled multi-function aperture.
Figure 4B:
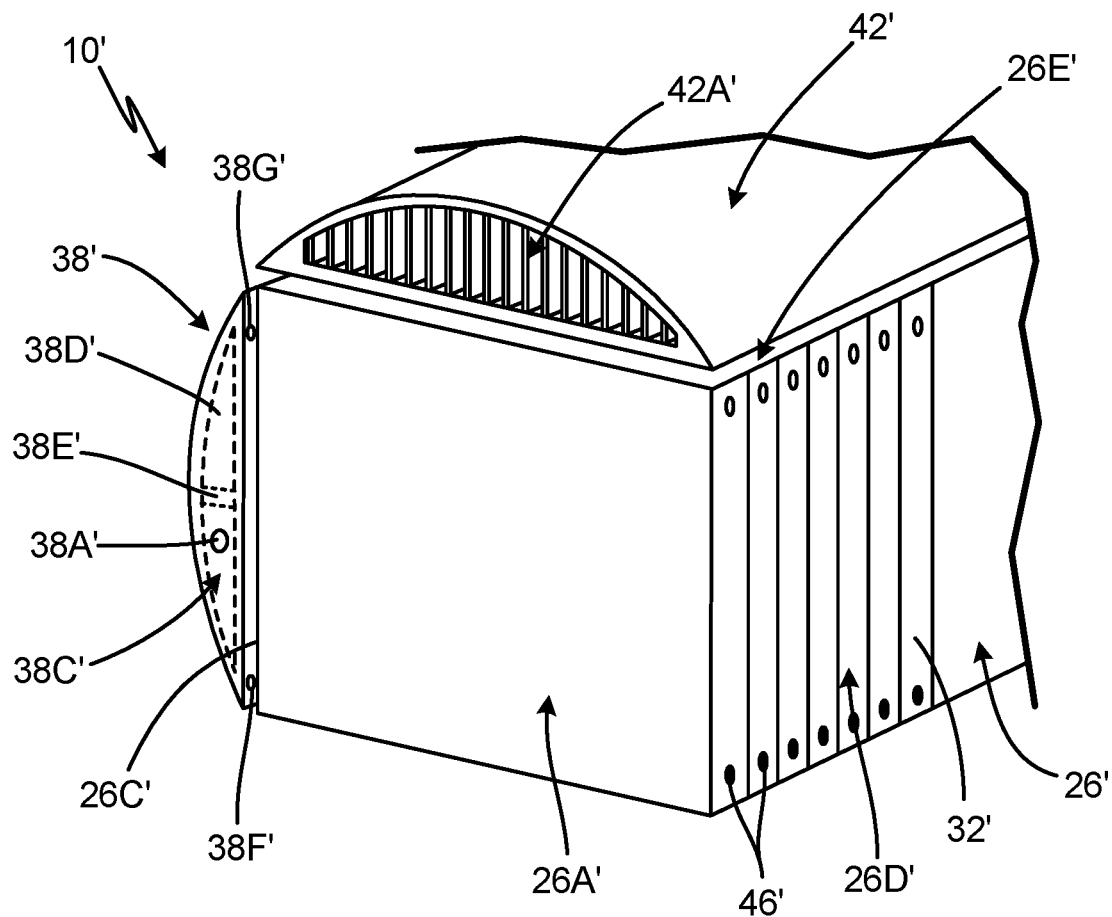
FIG. 4B is a close-up perspective view of a second embodiment of the fuel-cooled multi-function aperture.
Figure 4C:
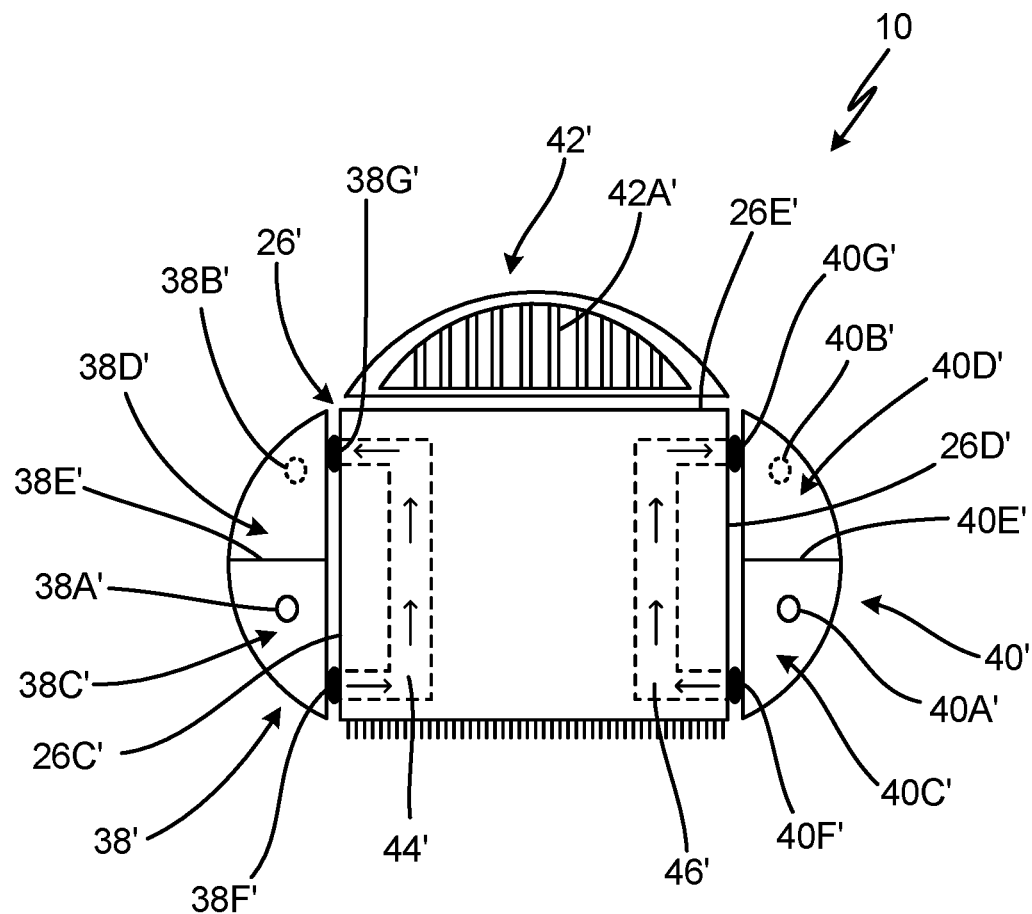
FIG. 4C is a front view of a second embodiment of the fuel-cooled multi-function aperture.

FIG. 4A is a perspective view of a second embodiment of FCMFA 10, referred to as FCMFA 10' in this embodiment. FIG. 4B is a close-up perspective view of the second embodiment of FCMFA 10' with first control circuit 34' removed for clarity. FIG. 4C is a front view of the second embodiment of FCMFA 10' with first control circuit 34' removed for clarity. FIGS. 4A-4C will be discussed together. FCMFA 10' includes MFA 26' first manifold 38', second manifold 40', and third manifold 42'. First manifold 38' is positioned on first side 26C' of MFA 26', second manifold 40' is positioned on second side 26D' of MFA 26', and third manifold 42' is positioned on third side 26E' of MFA 26'. Each of first manifold 38', second manifold 40', and third manifold 42' have a semi-circular profile with an outer diameter of ten inches or less.

First manifold 38' includes first inlet 38A', first outlet 38B', first cavity 38C', second cavity 38D', partition 38E', a plurality of first cavity apertures 38F', and a plurality of second cavity apertures 38G'. First inlet 38A' is positioned at first end 26A' of MFA 26' and first outlet 38B' is positioned at second end 26B' of MFA 26'. First cavity 38C' is a void within first manifold 38' positioned on one half of first manifold 38' and second cavity 38D' is a void within first manifold 38' positioned on the other half of first manifold 38', opposite first cavity 38C'. Partition 38E' is a wall or support extending the entire length of first manifold 38' and partition 38E' is positioned between first cavity 38C' and second cavity 38D'. Partition 38E' creates first cavity 38C' and second cavity 38D' within first manifold 38' and partition 38E' is configured to fluidly isolate first cavity 38C' from second cavity 38D'. The plurality of first cavity apertures 38F' are positioned within first cavity 38C' and extend along the entire length of a bottom portion of first manifold 38'. The plurality of second cavity apertures 38G' are positioned within second cavity 38D' and extend along the entire length of a top portion of first manifold 38'.

First manifold 38' is a fluidly sealed component with an outer cover and a void within the sealed outer cover, the void comprising of first cavity 38C' and second cavity 38D'. Each end of first manifold 38' includes a fluidly sealed cover with the exception of first inlet 38A' and first outlet 38B'. First inlet 38A' can be an aperture with a fluid-tight fitting suitable for transferring a liquid without leakage. Further, first inlet 38A' can be positioned on the half of first manifold 38' including first cavity 38C'. First outlet 38B' can be an aperture with a fluid-tight fitting suitable for transferring a liquid without leakage. Further, first outlet 38B' can be positioned on the half of first manifold 38' including second cavity 38D'. Each of the plurality of first cavity apertures 38F' and the plurality of second cavity apertures 38G' can be an opening or hole with a fluid-tight fitting suitable for transferring a liquid without leakage. The fluid-tight fitting can be positioned between each of the plurality of first cavity apertures 38F' and MFA 26' and also between each of the plurality of second cavity apertures 38G' and MFA 26'. The fluid-tight fitting can be a seal, a liquid quick-disconnect, a blind mate liquid connector, or an O-ring, among other options. Each of the plurality of first cavity apertures 38F' and second cavity apertures 38G' are aligned with and in fluid communication with first channel 44' of each rib 32' of MFA 26', discussed further below.

First manifold 38' is attached to each and every one of the plurality of circuit card modules 24' through a fastener on first side 26C' of MFA 26'. Attaching first manifold 38' to each circuit card module 24' secures circuit card module 24' in an assembled form creating MFA 26' and also enhances heat transfer from MFA 26'. First manifold 38' can be a single-piece construction that is manufactured using additive manufacturing technology. First manifold 38' can be constructed from a steel, aluminum, titanium, metal alloy, or a polymer. Additively manufacturing first manifold 38' provides the benefit of allowing first manifold 38' to be a single-piece construction, eliminating abutting components that would require additional sealing components. Therefore, additively manufacturing first manifold 38' eliminates locations for potential leakage. First manifold 38' is configured to receive fuel from fuel tank 14 (FIG. 1) through first inlet 38A', flow and fill the fuel into first cavity 38C' of first manifold 38', and dispense the fuel through the plurality of first cavity apertures 38F' into first channel 44' of each rib 32' of MFA 26'. The fuel that flows into first channel 44' absorbs heat produced by MFA 26' and removes the heat from MFA 26', cooling MFA 26' in the process. The heated fuel then flows through the plurality of second cavity apertures 38G' and into second cavity 38D' of first manifold 38'. The heated fuel flows into and fills second cavity 38D' and then dispenses through first outlet 38B' into conduit 10A, where the heated fuel is supplied to engine 18 for combustion.

Second manifold 40' includes second inlet 40A', second outlet 40B', third cavity 40C', fourth cavity 40D', partition 40E', a plurality of third cavity apertures 40F', and a plurality of fourth cavity apertures 40G'. Second inlet 40A' is positioned at first end 26A' of MFA 26' and second outlet 40B' is positioned at second end 26B' of MFA 26'. Third cavity 40C' is a void within second manifold 40' positioned on one half of second manifold 40' and fourth cavity 40D' is a void within second manifold 40' positioned on the other half of second manifold 40', opposite second cavity 38D'. Partition 40E' is a wall or support extending the entire length of second manifold 40' and partition 40E' is positioned between third cavity 40C' and fourth cavity 40D'. Partition 40E' creates third cavity 40C' and fourth cavity 40D' within second manifold 40' and partition 40E' is configured to fluidly isolate third cavity 40C' from fourth cavity 40D'. The plurality of third cavity apertures 40F' are positioned within third cavity 40C' and extend along the entire length of a bottom portion of second manifold 40'. The plurality of fourth cavity apertures 40G' are positioned within fourth cavity 40D' and extend along the entire length of a top portion of second manifold 40'.

Second manifold 40' is a fluidly sealed component with an outer cover and a void within the sealed outer cover, the void comprising of third cavity 40C' and fourth cavity 40D'. Each end of second manifold 40' includes a fluidly sealed cover with the exception of second inlet 40A' and second outlet 40B'. Second inlet 40A' can be an aperture with a fluid-tight fitting suitable for transferring a liquid without leakage. Further, second inlet 40A' can be positioned on the half of second manifold 40' including third cavity 40C'. Second outlet 40B' can be an aperture with a fluid-tight fitting suitable for transferring a liquid without leakage. Further, second outlet 40B' can be positioned on the half of second manifold 40' including fourth cavity 40D'. Each of the plurality of third cavity apertures 40F' and the plurality of fourth cavity apertures 40G' can be an opening or hole with a fluid-tight fitting suitable for transferring a liquid without leakage. The fluid-tight fitting can be positioned between each of the plurality of third cavity apertures 40F' and MFA 26' and also between each of the plurality of fourth cavity apertures 40G' and MFA 26'. The fluid-tight fitting can be a seal, a liquid quick-disconnect, a blind mate liquid connector, or an O-ring, among other options. Each of the plurality of third cavity apertures 40F' and fourth cavity apertures 40G' are aligned with and in fluid communication with second channel 46' of each rib 32' of MFA 26', discussed further below.

Second manifold 40' is attached to each and every one of the plurality of circuit card modules 24' through a fastener on second side 26D' of MFA 26'. Attaching second manifold 40' to each circuit card module 24' secures circuit card module 24' in an assembled form creating MFA 26' and also enhances heat transfer from MFA 26'. Second manifold 40' can be a single-piece construction that is manufactured using additive manufacturing technology. Second manifold 40' can be constructed from a steel, aluminum, titanium, metal alloy, or a polymer. Additively manufacturing second manifold 40' provides the benefit of allowing second manifold 40' to be a single-piece construction, eliminating abutting components that would require additional sealing components. Therefore, additively manufacturing second manifold 40' eliminates locations for potential leakage. Second manifold 40' is configured to receive fuel from fuel tank 14 (FIG. 1) through second inlet 40A', flow and fill the fuel into third cavity 40C' of second manifold 40', and dispense the fuel through the plurality of third cavity apertures 40F' into second channel 46' of each rib 32' of MFA 26'. The fuel that flows into second channel 46' absorbs heat produced by MFA 26' and removes the heat from MFA 26', cooling MFA 26' in the process. The heated fuel then flows through the plurality of fourth cavity apertures 40G' and into fourth cavity 40D' of second manifold 40'. The heated fuel flows into and fills fourth cavity 40D' and then dispenses through second outlet 40B' into conduit 10A, where the heated fuel is supplied to engine 18 for combustion.

Third manifold 42' is positioned on and attached to third side 26E' of MFA 26'. Third manifold 42' is an air-cooled heat-exchanger that includes internal channels 42A' for guiding air through third manifold 42'. Third manifold 42' also includes open ends at each of its ends configured to allow air to flow through internal channels 42A'. Third manifold 42' is attached to each and every one of the plurality of circuit card modules 24' through a fastener on third side 26E' of MFA 26'. Attaching third manifold 42 to each circuit card module 24' secures circuit card module 24' in an assembled form creating MFA 26' and also enhances heat transfer from MFA 26'. Third manifold 42' can be a single-piece construction that is manufactured using additive manufacturing technology. Third manifold 42' can be constructed from a steel, aluminum, titanium, metal alloy, or a polymer. Additively manufacturing third manifold 42' provides the benefit of allowing third manifold 42' to be a single-piece construction, eliminating abutting components that would require additional sealing components. Therefore, additively manufacturing third manifold 42' eliminates locations for potential leakage. Third manifold 42' is configured to receive cooling air through an open end of third manifold 42' and flow the cool air through internal channels 42A'. The air flowing through internal channels 42A' absorbs heat produced by MFA 26', removing heat from MFA 26' and cooling MFA 26' in the process. The heated air is then transferred to another system within the aircraft or is exhausted from the aircraft. In the embodiment shown, third manifold 42' is included in FCMFA 10' but in another embodiment third manifold 42' does not need to be included in FCMFA 10'.

In the embodiment shown in FIGS. 4A-4C, first channel 44' extends from first side 26C' of MFA 26' into a center portion of rib 32' and then first channel 44' exits through first side 26C' of MFA 26'. First channel 44' is configured to receive cool fuel through the plurality of first cavity apertures 38F' on first side 26C' of MFA 26, and then dispense heated fuel through the plurality of second cavity apertures 38G' of first side 26C' of MFA 26' into second cavity 38D'. Second channel 46' extends from second side 26D' of MFA 26' into a center portion of rib 32' and then second channel 46' exits through second side 26D' of MFA 26'. Second channel 46' is configured to receive cool fuel through the plurality of third cavity apertures 40F' on second side 26D' of MFA 26, and then dispense heated fuel through the plurality of fourth cavity apertures 40G' of second side 26C' of MFA 26' into fourth cavity 40D'.

Each rib 32' of MFA 26' includes first channel 44' in fluid communication with first manifold 38' and second channel 46' in fluid communication with second manifold 40'. Rib 32' can be a single-piece construction that is manufactured using additive manufacturing technology. Rib 32' can be constructed from a steel, aluminum, titanium, metal alloy, or a polymer. Additively manufacturing rib 32' provides the benefit of allowing rib 32' to be a single-piece construction, eliminating abutting components that would require additional sealing features. Therefore, additively manufacturing rib 32' eliminates locations for potential leakage. Additively manufacturing rib 32' also provides the benefit of allowing for complex fin and flow geometry of first channel 44' and second channel 46', which can be used to optimize the heat transfer between the fuel and rib 32'.

In operation, fuel from fuel tank 14 is pumped using fluid pump 16 through conduit 16A to FCMFA 10'. The cool fuel reaches a valve (not shown) where the fuel is split into individual tubes that are attached to first inlet 38A' and second inlet 40A' of first manifold 38' and second manifold', respectively. The fuel flows into first inlet 38A' and second inlet 40A' and into first cavity 38C' and third cavity 40C', respectively. The fuel then flows through the plurality of first cavity apertures 38F' and the plurality of third cavity apertures 40F' into first channel 44' and second channel 46', respectively, of each rib 32' of MFA 26'. The cool fuel flowing through first channel 44' and second channel 46' of each rib 32' absorbs heat produced by MFA 26', heating the fuel. The heated fuel then dispenses from first channel 44' through the plurality of second cavity apertures 38G' and into second cavity 38D' of first manifold 38'. Likewise, heated fuel dispenses from second channel 46' through the plurality of fourth cavity apertures 40G' and into fourth cavity 40D' of second manifold 40'. The heated fuel within second cavity 38D' and fourth cavity 40D' is then dispensed through first outlet 38B' and second outlet 40B', respectively, into conduit 10A. The fuel within conduit 10A then flows to engine 18 where the fuel is combusted. When the fuel is flowing through each manifold, the fuel remains separated and un-mixed. The fuel is only mixed again after it is dispensed into conduit 10A. The fuel removes heat from MFA 26' and cools MFA 26' more than can be achieved by using air as the cooling fluid. The use of both first channel 44' and second channel 46' increases the heat transfer rate and therefore increases the cooling of MFA 26'. Cooling of MFA 26' is key to the success of the system because a cooled MFA 26' has improved performance and reliability.

Discussion of Possible Embodiments

The following are non-exclusive descriptions of possible embodiments of the present invention.

A fuel-cooled multi-function aperture comprising a multi-function aperture comprising a plurality of circuit card modules, wherein each of the plurality of circuit card modules comprises a first circuit card; a second circuit card; and a rib positioned between the first circuit card and the second circuit card, wherein the rib includes a first channel and a second channel; and a first manifold including a first inlet and a second manifold including a second inlet, wherein the first inlet and the second inlet are configured to receive fuel and then flow the fuel into the first channel and the second channel of the rib to cool each of the plurality of circuit card modules.

The fuel-cooled multi-function aperture of the preceding paragraph can optionally include, additionally and/or alternatively, any one or more of the following features, configurations and/or additional components:

A further embodiment of the foregoing fuel-cooled multi-function aperture, wherein each of the plurality of circuit card modules is positioned adjacent to at least one of the plurality of circuit card modules in a stacked configuration.

A further embodiment of the foregoing fuel-cooled multi-function aperture, wherein the multi-function aperture further comprises a first control circuit positioned adjacent to one of the plurality of circuit card modules at a first end of the multi-function aperture; and a second control circuit positioned adjacent to one of the plurality of circuit card modules at a second end of the multi-function aperture.

A further embodiment of the foregoing fuel-cooled multi-function aperture, wherein the first circuit card is attached to a first side of the rib and the second circuit card is attached to a second side of the rib, opposite the first side of the rib.

A further embodiment of the foregoing fuel-cooled multi-function aperture, wherein the fuel is a liquid fuel capable of combustion in an internal combustion engine or a gas turbine engine.

A further embodiment of the foregoing fuel-cooled multi-function aperture, wherein the first circuit card includes eight electrical pins extending from one side of the first circuit card; and the second circuit card includes eight electrical pins extending from one side of the second circuit card; wherein the pins of the first circuit card and the second circuit card are parallel when installed on the rib positioned between the first circuit card and the second circuit card.

A further embodiment of the foregoing fuel-cooled multi-function aperture, wherein each of the plurality of circuit card modules is configured to transmit and receive one or more of radar, communication, and other signals; and the multi-function aperture is a phased array antenna configured to transmit and receive a plurality of radar, communication, and other signals.

A further embodiment of the foregoing fuel-cooled multi-function aperture, wherein the profile of the first manifold is a semi-circle with an outer diameter of ten inches or less; and the profile of the second manifold is a semi-circle with an outer diameter of ten inches or less.

A further embodiment of the foregoing fuel-cooled multi-function aperture, wherein the first manifold, the second manifold, and the rib can each be constructed from one of a steel, aluminum, titanium, metal alloy, copper, or polymer.

A further embodiment of the foregoing fuel-cooled multi-function aperture, wherein a fluid pump forces the fuel to flow from a fuel tank to the first inlet of the first manifold and the second inlet of the second manifold.

A further embodiment of the foregoing fuel-cooled multi-function aperture, wherein the rib of each of the plurality of circuit card modules is manufactured using additive manufacturing technology as a single-piece construction.

A further embodiment of the foregoing fuel-cooled multi-function aperture, wherein the fuel flowing through the first channel and the second channel of each rib absorbs and removes heat from the multi-function aperture.

A further embodiment of the foregoing fuel-cooled multi-function aperture, wherein the heated fuel dispensing from the fuel-cooled multi-function aperture flows to an internal combustion engine or a gas turbine engine where the fuel is combusted.

A further embodiment of the foregoing fuel-cooled multi-function aperture, wherein the first manifold is attached to a first side of the multi-function aperture and the second manifold is attached to a second side of the multi-function aperture, opposite the first side of the multi-function aperture.

A further embodiment of the foregoing fuel-cooled multi-function aperture, wherein the first manifold is in fluid communication with each of the ribs of each of the plurality of circuit card modules through a plurality of first apertures in the first manifold and a seal is positioned between the plurality of first apertures and the first channels; and the second manifold is in fluid communication with each of the ribs of each of the plurality of circuit card modules through a plurality of second apertures in the second manifold and a seal is positioned between the plurality of second apertures and the second channels.

A further embodiment of the foregoing fuel-cooled multi-function aperture, wherein the first channel of each rib extends from a first side of the multi-function aperture into a center portion of the rib and exits through a third side of the multi-function aperture, wherein the first channel is configured to receive cool fuel through the first side of the multi-function aperture and dispense heated fuel through the third side of the multi-function aperture; and the second channel of each rib extends from a second side of the multi-function aperture into the center portion of the rib and exits through the third side of the multi-function aperture, wherein the second channel is configured to receive cool fuel through the second side of the rib and dispense heated fuel through the third side of the multi-function aperture.

A further embodiment of the foregoing fuel-cooled multi-function aperture, and further comprising a third manifold positioned adjacent to and attached to a third side of the multi-function aperture, wherein the third manifold includes a plurality of third apertures aligned with the first channel and the second channel on the third edge of each rib, wherein the plurality of third apertures are configured to receive the heated fuel dispensed from the third edge of each rib; and a manifold outlet configured to dispense heated fuel from the fuel-cooled multi-function aperture.

A further embodiment of the foregoing fuel-cooled multi-function aperture, wherein the first channel of each rib extends from a first edge of the rib into a center portion of the rib and exits through the first edge of the rib, wherein the first channel is configured to receive cool fuel through the first edge of the rib and dispense heated fuel through the first edge of the rib; and the second channel of each rib extends from a second edge of the rib into the center portion of the rib and exits through the second edge of the rib, wherein the second channel is configured to receive cool fuel through the second edge of the rib and dispense heated fuel through the second edge of the rib.

A further embodiment of the foregoing fuel-cooled multi-function aperture, wherein cool fuel received from a first cavity of the first manifold enters the first channel at a bottom position, flows through the first channel of each rib, and heated fuel exits the first channel at a top position into a second cavity of the first manifold, separate from the first cavity; cool fuel received from a third cavity of the second manifold enters the second channel at a bottom position, flows through the second channel of each rib, and heated fuel exits the second channel at a top position into a fourth cavity of the second manifold, separate from the third cavity; and the first manifold includes a first outlet and the second manifold includes a second outlet, wherein the first outlet and the second outlet are configured to dispense heated fuel from the fuel-cooled multi-function aperture.

A method of cooling a multi-function aperture, the method comprising transferring fuel from a fuel tank to the multi-function aperture; flowing the fuel through at least one rib of the multi-function aperture; removing heat from the multi-function aperture as the fuel flows through the at least one rib of the multi-function aperture; and transferring the fuel to an engine for combustion by the engine.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A fuel-cooled multi-function aperture comprising:
a multi-function aperture comprising a plurality of circuit card modules, wherein each of the plurality of circuit card modules comprises:
 a first circuit card;
 a second circuit card; and
 a rib positioned between the first circuit card and the second circuit card, wherein each rib includes:
  a first channel extending from a first edge of the rib into a center portion of the rib and exiting through a third edge of the rib, wherein the first channel is configured to receive cool fuel through the first edge of the rib and dispense heated fuel through the third edge of the rib; and
  a second channel extending from a second edge of the rib into the center portion of the rib and exiting through the third edge of the rib, wherein the second channel is configured to receive cool fuel through the second edge of the rib and dispense heated fuel through the third edge of the rib; and
 a first manifold including a first inlet and a second manifold including a second inlet,
 wherein the first inlet and the second inlet are configured to receive fuel and are in fluid communication with the first channel and the second channel of the rib.

2. The fuel-cooled multi-function aperture of claim 1, wherein each of the plurality of circuit card modules is positioned adjacent to at least one of the plurality of circuit card modules in a stacked configuration.

3. The fuel-cooled multi-function aperture of claim 1, wherein the multi-function aperture further comprises:
 a first control circuit positioned adjacent to one of the plurality of circuit card modules at a first end of the multi-function aperture; and
 a second control circuit positioned adjacent to one of the plurality of circuit card modules at a second end of the multi-function aperture.

4. The fuel-cooled multi-function aperture of claim 1, wherein the first circuit card is attached to a first side of the rib and the second circuit card is attached to a second side of the rib, opposite the first side of the rib.

5. The fuel-cooled multi-function aperture of claim 1, wherein the fuel is a liquid fuel capable of combustion in an internal combustion engine or a gas turbine engine.

6. The fuel-cooled multi-function aperture of claim 1, wherein:
 the first circuit card includes eight electrical pins extending from one side of the first circuit card; and
 the second circuit card includes eight electrical pins extending from one side of the second circuit card;
 wherein the pins of the first circuit card and the second circuit card are parallel when installed on the rib positioned between the first circuit card and the second circuit card.

7. The fuel-cooled multi-function aperture of claim 1, wherein:
 each of the plurality of circuit card modules is configured to transmit and receive one or more of radar, communication, and other signals; and
 the multi-function aperture is a phased array antenna configured to transmit and receive a plurality of radar, communication, and other signals.

8. The fuel-cooled multi-function aperture of claim 1, wherein:
 the profile of the first manifold is a semi-circle with an outer diameter of ten inches or less; and
 the profile of the second manifold is a semi-circle with an outer diameter of ten inches or less.

9. The fuel-cooled multi-function aperture of claim 1, wherein the first manifold, the second manifold, and each rib can each be constructed from one of a steel, aluminum, titanium, metal alloy, copper, or polymer.

10. The fuel-cooled multi-function aperture of claim 1, wherein a fluid pump forces the fuel to flow from a fuel tank to the first inlet of the first manifold and the second inlet of the second manifold.

11. The fuel-cooled multi-function aperture of claim 1, wherein the rib of each of the plurality of circuit card modules is manufactured using additive manufacturing technology as a single-piece construction.

12. The fuel-cooled multi-function aperture of claim 1, wherein the fuel flowing through the first channel and the second channel of each rib removes heat from the multi-function aperture.

13. The fuel-cooled multi-function aperture of claim 12, wherein the heated fuel dispensing from the fuel-cooled multi-function aperture flows to an internal combustion engine or a gas turbine engine where the fuel is combusted.

14. The fuel-cooled multi-function aperture of claim 1, wherein the first manifold is attached to a first side of the multi-function aperture and the second manifold is attached to a second side of the multi-function aperture, opposite the first side of the multi-function aperture.

15. The fuel-cooled multi-function aperture of claim 1, wherein:
   the first manifold is in fluid communication with each of the ribs of each of the plurality of circuit card modules through a plurality of first apertures in the first manifold and a seal is positioned between the plurality of first apertures and the first channels; and
   the second manifold is in fluid communication with each of the ribs of each of the plurality of circuit card modules through a plurality of second apertures in the second manifold and a seal is positioned between the plurality of second apertures and the second channels.

16. The fuel-cooled multi-function aperture of claim 1, wherein:
   cool fuel received from a first cavity of the first manifold enters the first channel at a bottom position, flows through the first channel of each rib, and heated fuel exits the first channel at a top position into a second cavity of the first manifold, separate from the first cavity;
   cool fuel received from a third cavity of the second manifold enters the second channel at a bottom position, flows through the second channel of each rib, and heated fuel exits the second channel at a top position into a fourth cavity of the second manifold, separate from the third cavity; and
   the first manifold includes a first outlet and the second manifold includes a second outlet, wherein the first outlet and the second outlet are configured to dispense heated fuel from the fuel-cooled multi-function aperture.

* * * * *